United States Patent
Chung et al.

(10) Patent No.: US 12,302,495 B2
(45) Date of Patent: May 13, 2025

(54) INTERPOSER STRUCTURE AND AN ELECTRONIC DEVICE INCLUDING THE SAME

(71) Applicant: Samsung Electronics Co., Ltd., Suwon-si (KR)

(72) Inventors: Yeonkyung Chung, Suwon-si (KR); Jichul Kim, Suwon-si (KR); Jinyong Park, Suwon-si (KR); Gyeongmin Jin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 17/900,687

(22) Filed: Aug. 31, 2022

(65) Prior Publication Data
US 2022/0418108 A1 Dec. 29, 2022

Related U.S. Application Data

(63) Continuation of application No. PCT/KR2021/014133, filed on Oct. 13, 2021.

(30) Foreign Application Priority Data

Oct. 13, 2020 (KR) .......................... 10-2020-0132005

(51) Int. Cl.
*H05K 1/11* (2006.01)
*H04M 1/02* (2006.01)
(Continued)

(52) U.S. Cl.
CPC .......... *H05K 1/115* (2013.01); *H04M 1/0277* (2013.01); *H05K 1/0204* (2013.01); *H05K 1/111* (2013.01); *H05K 3/3457* (2013.01)

(58) Field of Classification Search
CPC ...... H01L 23/345; H05K 1/144; H05K 1/111; H05K 1/0204; H05K 1/0207
See application file for complete search history.

(56) References Cited

U.S. PATENT DOCUMENTS 10,010,012 B2 * 6/2018 Yoo ...................... H05K 1/0203
2005/0023275 A1    2/2005 Lazaro Gallego
(Continued)

FOREIGN PATENT DOCUMENTS

JP    2006-332325 A    12/2006
JP    2011-044512 A     3/2011
(Continued)

OTHER PUBLICATIONS

International Search Report dated Feb. 9, 2022 in connection with International Patent Application No. PCT/KR2021/014133, 2 pages.
(Continued)

*Primary Examiner* — James Wu

(57) ABSTRACT

According to an embodiment, an electronic device may include a first printed circuit board (PCB), a second PCB having a shape corresponding to the first PCB, and an interposer surrounding a space between the first PCB and the second PCB and including multiple pads, wherein the interposer may include a first surface in contact with the first PCB, a second surface in contact with the second PCB, a first lateral surface facing the space, and a second lateral surface opposite to the first lateral surface, and a first point exposed through the second lateral surface, a second point exposed through one of the first lateral surface or the second lateral surface, and a heat conduction pattern disposed on the first surface in an area between the multiple pads to connect the first point and the second point.

20 Claims, 13 Drawing Sheets

(51) Int. Cl.
*H05K 1/02* (2006.01)
*H05K 3/34* (2006.01)

(56) References Cited

U.S. PATENT DOCUMENTS

| | | | |
|---|---|---|---|
| 2012/0275128 A1* | 11/2012 | Takada | H05K 13/0465 |
| | | | 29/739 |
| 2016/0351526 A1* | 12/2016 | Boyd | H01L 24/75 |
| 2017/0179069 A1* | 6/2017 | Carstens | B23K 1/19 |
| 2020/0205299 A1 | 6/2020 | Thibado et al. | |

FOREIGN PATENT DOCUMENTS

| | | |
|---|---|---|
| KR | 10-2008-0006047 A | 1/2008 |
| KR | 10-0852374 B1 | 8/2008 |
| KR | 10-2016-0113690 A | 9/2016 |
| KR | 2017-0073478 A | 6/2017 |

OTHER PUBLICATIONS

Written Opinion of the International Searching Authority dated Feb. 9, 2022 in connection with International Patent Application No. PCT/KR2021/014133, 4 pages.

Office Action issued Feb. 24, 2025, in connection with Korean Patent Application No. 10-2020-0132005, 14 pages.

\* cited by examiner

INTERPOSER STRUCTURE AND AN ELECTRONIC DEVICE INCLUDING THE SAME

CROSS-REFERENCE TO RELATED APPLICATIONS

This application is a continuation of International Application No. PCT/KR2021/014133 filed on Oct. 13, 2021, which claims priority to Korean Patent Application No. 10-2020-0132005 filed on Oct. 13, 2020, the disclosures of which are herein incorporated by reference in their entirety.

BACKGROUND

1. Field

Various embodiments of the disclosure relate to an interposer structure and an electronic device including the same.

2. Description of Related Art

Electronic devices tend to have smaller sizes while having more diversified functions, and it has thus become important to secure spaces for high-density arrangement of electronic components (for example, processors, communication circuits, or memories) for performing various functions of electronic devices.

In order to secure spaces in which electronic components can be arranged, an increasing number of electronic devices have recently used interposers to form a stacked structure of multiple PCBs. For example, an electronic device may have multiple stacked PCBs and may have an interposer which has at least one via for electrically connecting PCBs, and which is arranged between the stacked PCBs, thereby securing a space in which electronic components can be arranged.

In order to repair a printed board assembly (PBA) including multiple stacked PCBs, the multiple stacked PCBs and the interposer need to be detached.

If infra-red (IR) heating type is used, an entire surface of each PCB or the entire interposer is inevitably heated, making it difficult to selectively heat the desired part to be detached. In addition, if the stacked structure is peeled according to such a conventional heating type, pad detachment may occur.

Various embodiments of the disclosure may provide a circuit board (for example, printed board assembly (PBA)) including a designated pattern (for example, heat conduction pattern). For example, an electric current may be applied to the designated pattern so as to separate and/or bond soldering parts of the circuit board.

According to various embodiments of the disclosure, a differently configured electric current may be applied to the designated pattern according to the type of solder soldered on the circuit board. For example, the magnitude of the electric current applied to the circuit board may be differently configured, based on the melting point of solder.

SUMMARY

According to various embodiments of the disclosure, an electronic device may include a first printed circuit board (PCB), a second PCB having a shape corresponding to the first PCB, and an interposer surrounding a space between the first PCB and the second PCB and including multiple pads, wherein the interposer may include a first surface in contact with the first PCB, a second surface in contact with the second PCB, a first lateral surface facing the space, and a second lateral surface opposite to the first lateral surface, a first point exposed through the second lateral surface, a second point exposed through one of the first lateral surface or the second lateral surface, and a heat conduction pattern disposed on the first surface in an area between the multiple pads to connect the first point and the second point.

According to various embodiments of the disclosure, an interposer may include a first surface, a second surface parallel to the first surface, a first lateral surface perpendicular to the first surface and the second surface, and a second lateral surface parallel to the first lateral surface. According to an embodiment, the interposer may include multiple pads arranged on the first surface of the interposer to allow one ends thereof to be exposed, and a first point exposed through the second lateral surface, a second point exposed through one of the first lateral surface or the second lateral surface, and a heat conduction pattern disposed on the first surface in an area between the multiple pads to connect the first point and the second point.

According to an embodiment, an electronic device may include a first printed circuit board (PCB), a second PCB having a shape corresponding to the first PCB, and an interposer forming a closed space by coupling to the first PCB and the second PCB and including multiple pads, wherein the interposer includes a heat conduction pattern disposed on a surface of the interposer, wherein the heat conduction pattern connects a first point of the surface of the interposer to a second point different from the first point and is disposed on an area between the multiple pads.

An interposer according to various embodiments of the disclosure may have a heat conduction pattern disposed on a surface near a pad such that a desired area can be selectively heated, thereby preventing pad detachment.

According to various embodiments, even in the case of a stacked structure including multiple interposers, desired parts can be selectively separated and/or bonded.

Various other advantageous effects inferred directly or indirectly through the document may be provided.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code"

includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
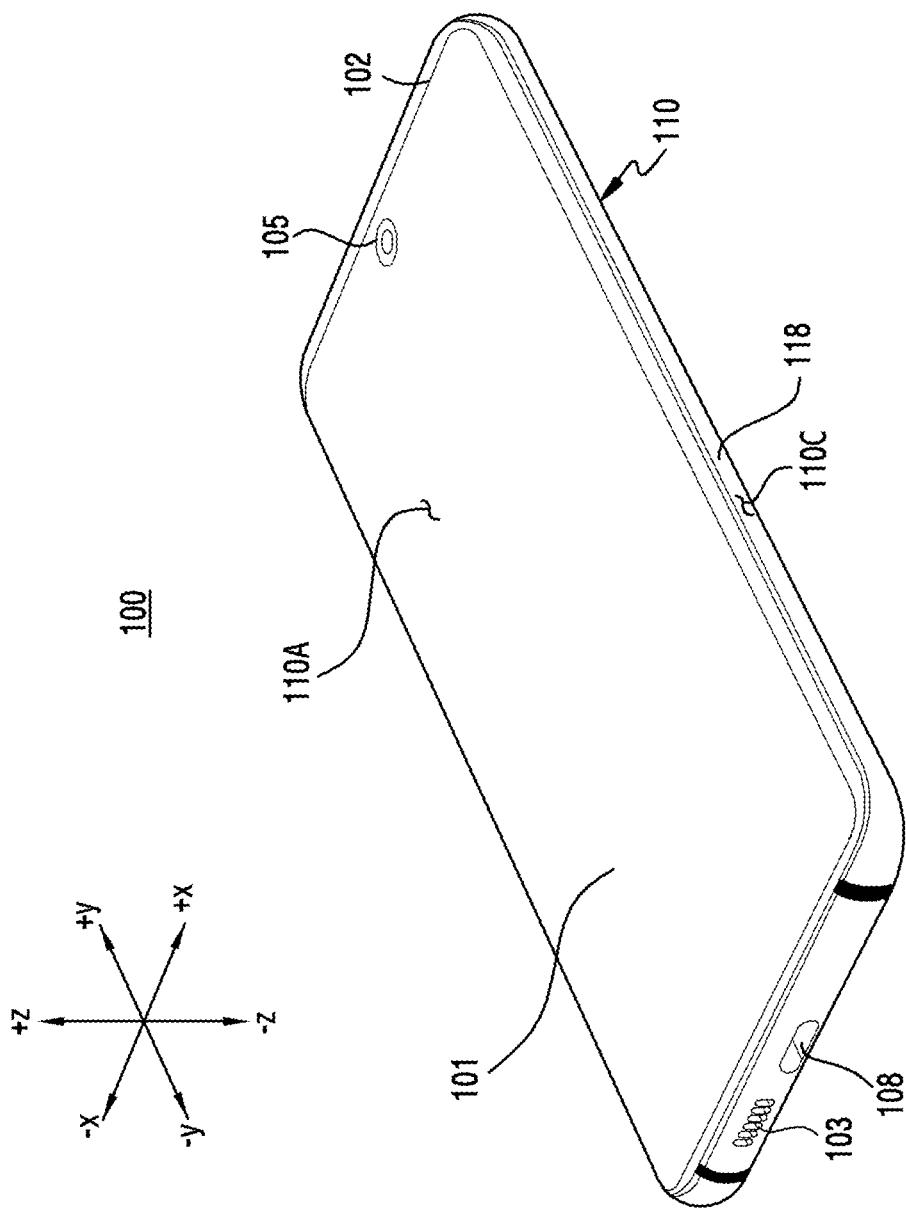
FIG. 1 is a perspective view illustrating a front surface of an electronic device according to an embodiment.
Figure 2:
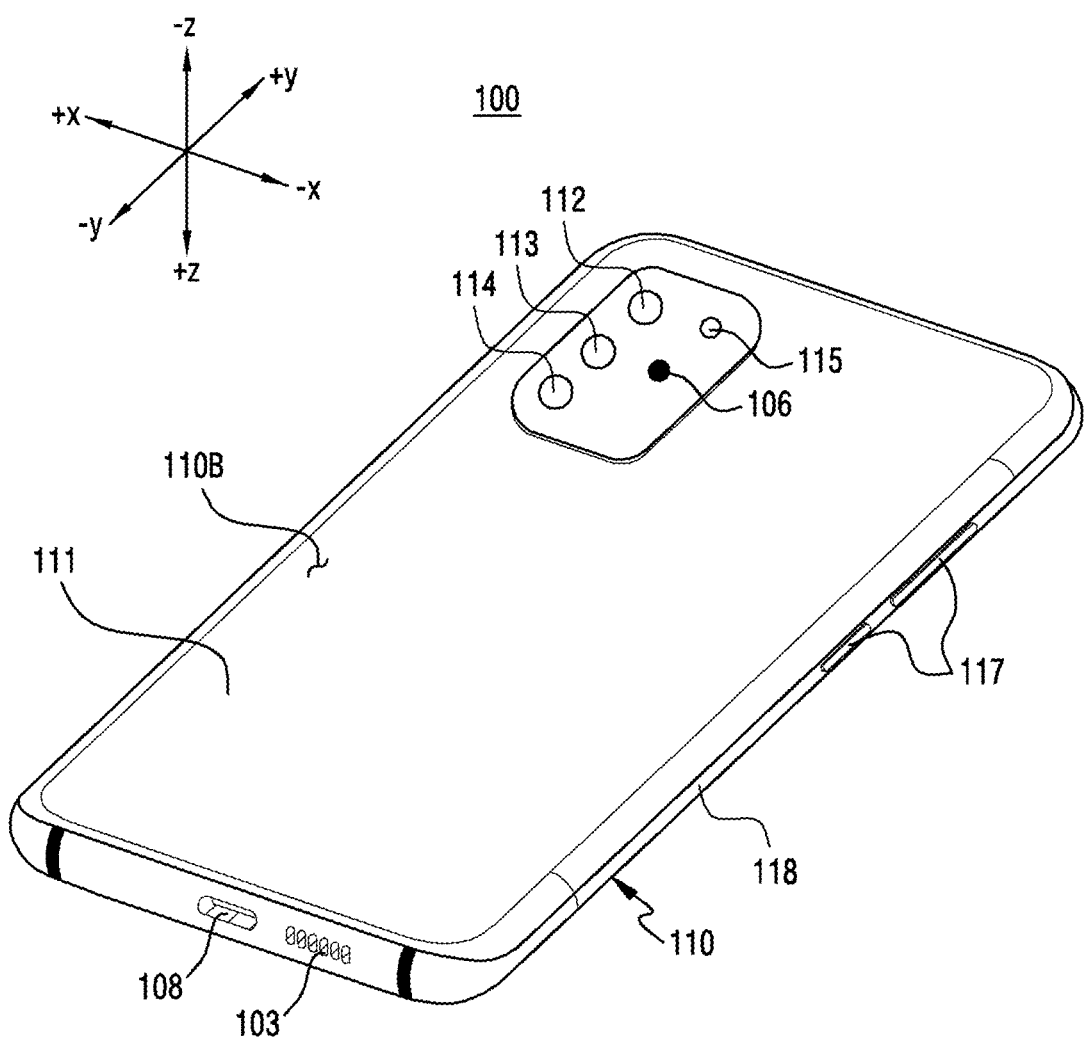
FIG. 2 is a perspective view illustrating a rear surface of the electronic device of FIG. 1.

FIG. 1 is a perspective view illustrating a front surface of an electronic device according to an embodiment and FIG. 2 is a perspective view illustrating a rear surface of the electronic device of FIG. 1.

Referring to FIG. 1 and FIG. 2 together, the electronic device 100 according to an embodiment may include a housing 110 including a first surface (or "front surface") 110A, a second surface (or "rear surface") 110B, and a lateral surface (or "lateral wall") 110C surrounding a space between the first surface 110A and the second surface 110B. According to another embodiment (not shown), the housing 110 may refer to a structure for configuring a portion of the first surface 110A, the second surface 110B, and the lateral surface 110C in FIG. 1 and FIG. 2.

According to an embodiment, at least a portion of the first surface 110A may be formed of substantially transparent front plate 102 (e.g.: glass plate including various coating layers or polymer plate). According to an embodiment, the front plate 102 may include a curved surface portion seamlessly extending on at least one side edge portion while bending from the first surface 110A toward the rear plate 111.

According to an embodiment, the second surface 110B may be formed of the substantially opaque rear plate 111. The rear plate 111 may be formed by, for example, coated or colored glass, ceramic, polymers, metals (e.g.: aluminum, stainless steel (ST S), or magnesium), or a combination of at least two thereof. According to an embodiment, the rear plate 111 may include a curved surface portion seamlessly extending on at least one side edge portion while bending from the second surface 110B toward the front plate 102.

According to an embodiment, the lateral surface 110C may be coupled to the front plate 102 and the rear plate 111 and may be configured by a metal frame 118 including a metal. In an embodiment, the rear plate 111 and the metal frame 118 may be integrally formed and include the same material (e.g.: metal material such as aluminum).

Figure 11:
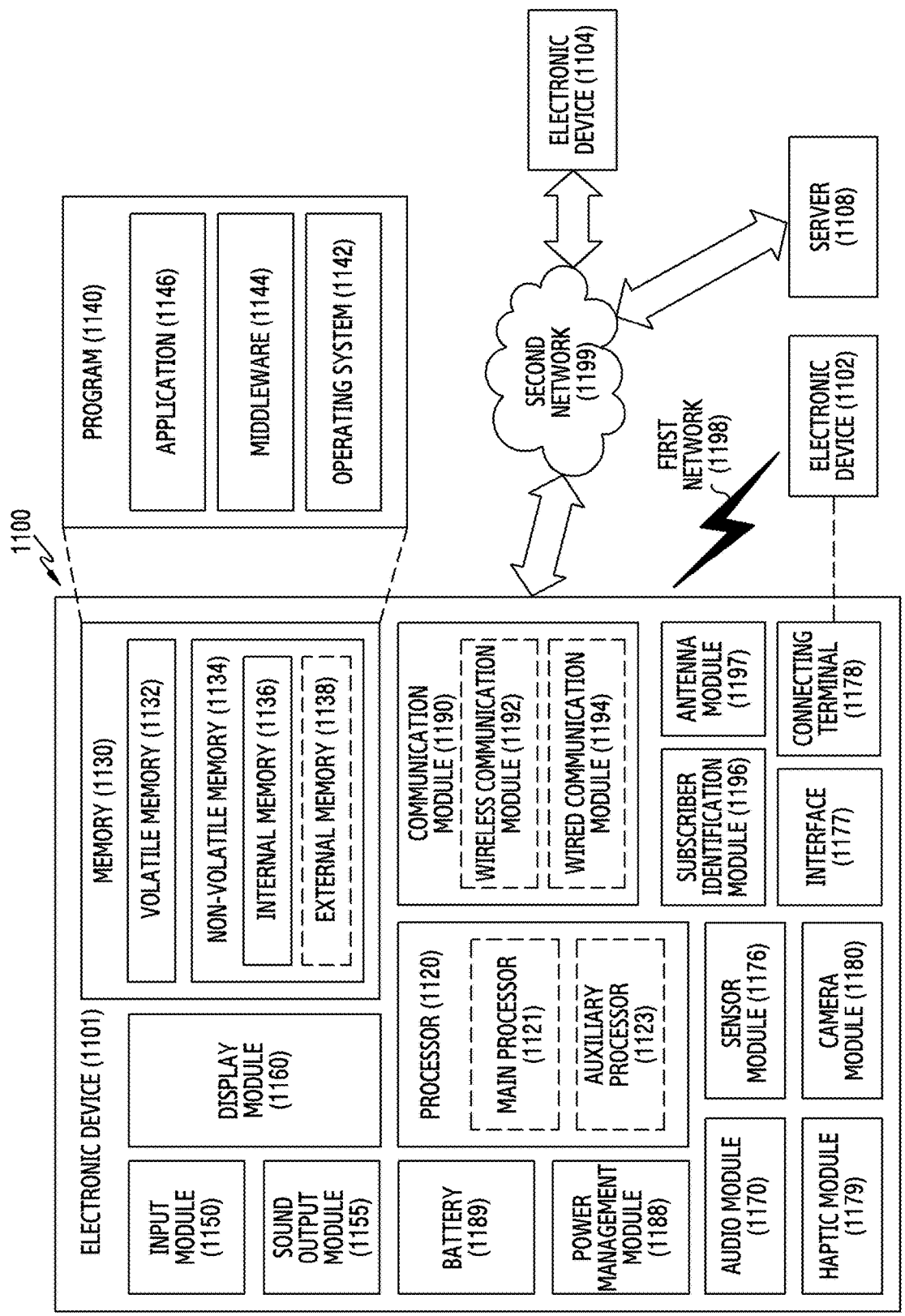
FIG. 11 is a block diagram illustrating an electronic device in a network environment according to various embodiments.

According to an embodiment, the electronic device 100 may include at least one of a display 101 (e.g.: display module 1160 of FIG. 11), an audio module 103 (e.g.: audio module 1170 of FIG. 11), a sensor module (not shown) (e.g.: sensor module 1176 of FIG. 11), a camera module 105, 112, 113, 114, and 115 (e.g.: camera module 1180 of FIG. 11), a flash 106, a key input device 117 (e.g.: input module 1150 of FIG. 11), and a connector hole 108 (e.g.: connection terminal 1178 of FIG. 11). In an embodiment, the electronic device 100 may omit at least one component (e.g.: key input device 117) or additionally include another component. For example, the electronic device 100 may include an unillustrated sensor module. By way of example, a sensor such as a proximity sensor or illuminance sensor in an area provided by the front plate 102 may be integrated into the display 101 or disposed at a position adjacent to the display 101. In an embodiment, the electronic device 100 may further include a light emitting element, and the light emitting element may be disposed at a position adjacent to the display 101 in an area provided by the front plate 102. The light emitting element may provide state information of the electronic device 100 in a form of light, for example. In another embodiment, the light emitting element may provide, for example, a light source associated with an operation of the camera module 105. The light emitting element may include, for example, a light emitting diode (LED), an infrared LED (IR LED), and a xenon lamp.

The display 101 may be exposed to outside the electronic device 100 through, for example, a substantial portion of the front plate 102. According to an embodiment, an edge of the display 101 may be configured to be substantially identical to an outer periphery (e.g.: curved surface) adjacent to the front plate 102. According to another embodiment (not shown), in order to expand an area through which the display 101 is exposed, a gap between an outer periphery of the display 101 and an outer periphery of the front plate 102 may be substantially identical. According to another embodiment (not shown), the display 101 may include an opening formed on a portion of a screen display area, and may include another electronic component, arranged with the opening, for example, the camera module 105, an proximity sensor or illuminance sensor (not shown).

According to an embodiment, at least one camera device 105, 112, 113, 114 and 115 may be disposed in a downward direction (e.g.: −z direction) of the display 101. For example, the first camera 105 device may be disposed on at least a portion of the display 101, corresponding to a field of view (FOV) of the camera. As the first camera device 105 is disposed on at least a portion of the display 101, corresponding to a field of view (FOV) of the camera, a position of the first camera device 105 may not be visually distinguished (or exposed). According to an embodiment, when the display 101 is viewed from the first surface 110A, as disposed on at least a portion of the display 101, the portion corresponding to a field of view (FOV) of the camera, the first camera 105 may obtain an image of an external object while not being visually exposed to outside. For example, the first camera device 105 may be an under display camera (UDC).

According to an embodiment, the electronic device 100 may include a display (not shown) slidably disposed to provide a screen (e.g.: display area). For example, a display area of the electronic device 100 may be an area which is visually exposed and capable of outputting an image. In an embodiment, the electronic device 100 may adjust a display area according to movement of a sliding plate (not shown) or movement of a display. For example, the electronic device 100 may include a rollable-type electronic device configured to selectively expand a display area by allowing at least a portion (e.g.: housing 110) of the electronic device 100 to be partially slidable. The display described above may refer to a slide-out display or an expandable display.

According to another embodiment (not shown), at least one of a camera module (e.g.: 112, 113, 114, or 115), a fingerprint sensor, and a flash 106 may be included in a rear surface (e.g.: second surface 110B) of a screen display area of the display 101. According to another embodiment (not shown), the display 101 may be combined to or disposed adjacent to a touch sensing circuit, a pressure sensor for measuring a strength (pressure) of a touch, and/or a digitizer for detecting a magnetic field-type stylus pen.

According to an embodiment, the audio module 103 may include a microphone hole and/or a speaker hole. A microphone for obtaining a sound from outside may be disposed in the microphone hole and according to an embodiment, multiple microphones may be arranged to detect a direction of a sound. According to an embodiment, a speaker hole and a microphone hole may be integrated into one hole and a speaker may be included without a speaker hole (e.g.: piezo speaker). For example, a speaker hole may include an outer speaker hole and a receiver hole for calling.

According to an embodiment, the electronic device 100 may include a sensor module (not shown) and may generate an electrical signal or a data value corresponding to an internal operation state or external environment state. For example, the sensor module may further include a proximity sensor disposed on the first surface 110A of the housing 110, a fingerprint sensor integrated onto or disposed adjacent to the display 101, and/or a biometric sensor (e.g.: HRM sensor) disposed on the second surface 110B of the housing 110. The electronic device 100 according to an embodiment may further include at least one unillustrated sensor module, for example, a gesture sensor, a gyro sensor, an air pressure sensor, a magnetic sensor, an acceleration sensor, a grip sensor, a color sensor, an infrared (IR) sensor, a biometric sensor, a temperature sensor, humidity sensor, or an illuminance sensor.

According to an embodiment, the camera module 105, 112, 113, 114, or 115 may include the first camera device 105 disposed on the first surface 110A of the electronic device 100 and the second camera device 112, 113, 114, or 115 disposed on the second surface 110B. For example, the camera devices 105, 112, 113, 114, or 115 may include one or more of lenses, an image sensor, and/or an image signal processor. According to another embodiment, the flash 106 may include a light emitting diode or a xenon lamp. According to an embodiment, two or more lenses (infrared camera, and wide-angle or telephoto lens) and image sensors may be arranged on one surface of the electronic device 100.

According to an embodiment, the key input device 117 may be disposed on the lateral surface 110C of the housing 110. According to another embodiment, the electronic device 100 may not include a portion or entirety of the key input device 117 described above, and the excluded key input device 117 may be implemented as various forms such as a soft key on the display 101. According to an embodiment, the key input device may include at least a portion of a fingerprint sensor disposed on the second surface 110B of the housing 110.

According to an embodiment, the connector hole 108 may receive a connector for transmitting or receiving power and/or data to or from an external electronic device, and/or a connector for transmitting or receiving an audio signal to or from an external electronic device. For example, the connector hale 108 may include a USB connector or an earphone jack. According to an embodiment, the USB connector and the earphone jack may be integrated into one hole (e.g.: connector hole 108 of FIG. 1 and FIG. 2), and according to another embodiment, the electronic device 100 may transmit or receive power and/or data, and an audio signal to or from an external electronic device without a separate connector hole.

Figure 3:
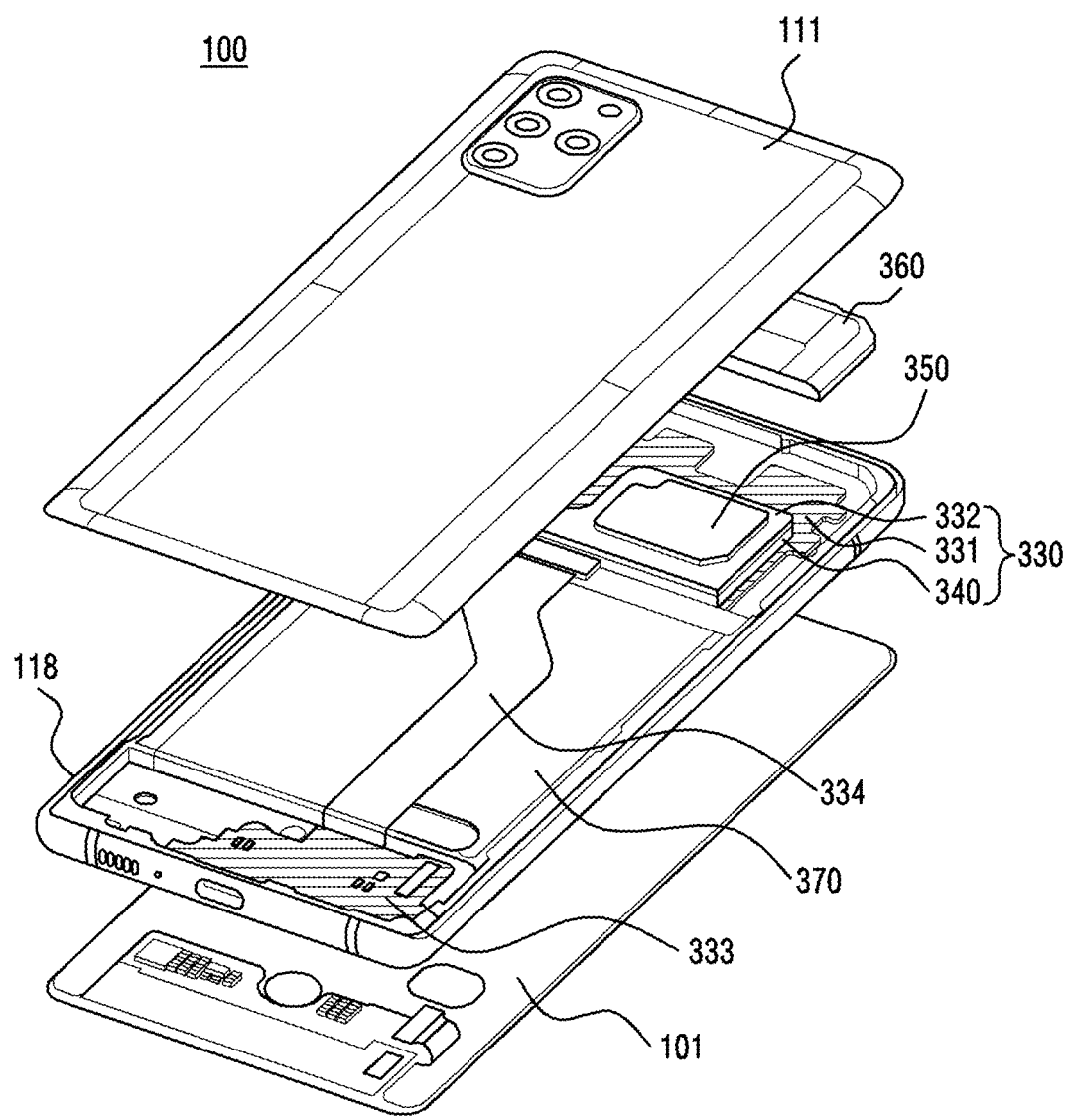
FIG. 3 is an exploded perspective view illustrating an electronic device according to an embodiment.

FIG. 3 is an exploded perspective view illustrating an electronic device according to an embodiment.

Referring to FIG. 3, an electronic device 100 according to an embodiment may include a front plate (not shown) (e.g.: front plate 102 of FIG. 1), a display 101, a metal frame 118, a printed circuit board structure 330 (e.g.: printed circuit board (PCB), flexible PCB (FPCB), PBA, or rigid-flexible PCB (RFPCB)), a shield structure 350, a rear case 360, a battery 370, and a rear plate 111. According to another embodiment (not shown), the electronic device 100 may omit at least one component (e.g.: shield structure 350 or rear case 360) among components described above or additionally include another component.

According to an embodiment, the metal frame 118 may be interposed between the display 101 and the rear plate 111. For example, the metal frame 118 may be formed of a conductive material (e.g.: metal) and may form a lateral surface (e.g.: lateral surface 110C of FIG. 1) of the electronic device 100. For example, the metal frame 118 may include at least one conductive portion and/or at least one nonconductive portion for insulating the at least one conductive portion. The at least one conductive portion of the metal frame 118 may be performed as an antenna radiator for transmitting and/or receiving an RF signal of a specified frequency band.

According to an embodiment, an antenna structure may be formed by the metal frame 118. For example, an antenna (or "antenna structure") (not shown) may be disposed in at least a portion of a space formed by the metal frame 118. In an embodiment, the antenna may include at least one radiating conductor (or "radiator") and may transmit or receive a wireless signal (or radio frequency (RF) signal) with power feeding provided from a communication module (or "wireless communication circuit") (e.g.: wireless communication module 1192 of FIG. 11) disposed on the printed circuit board structure 330. The "communication" disclosed herein may refer to at least one of transmitting a wireless signal, receiving a wireless signal, and/or transmitting and receiving wireless signal, and may be used having the same meaning hereinafter.

According to an embodiment, the antenna may be an antenna configured to transmit and/or receive a wireless signal in a frequency band equal to or higher than tens of GHz. For example, the antenna may be an antenna for communication in a millimeter wave (mmWave). According to another embodiment, the antenna may include multiple antennas for communication in multiple different frequency bands. For example, the antenna may include a first antenna for communication in a first frequency band (e.g.: about 10 GHz) and a second antenna for communication in a second frequency band (e.g.: about 18 GHz).

According to an embodiment, the printed circuit board structure 330 may be disposed at an area in the electronic device 100. The printed circuit board structure 330 disclosed herein may refer to a structure in which multiple PCBs (331 and 332) are stacked. For example, the printed circuit board structure 330 may include a first PCB 331, a second PCB 332, and/or an interposer 340. For another example, the printed circuit board structure 330 may be a structure in which the interposer 340 and the second PCB 332 are consecutively stacked based on the first PCB 331.

According to an embodiment, the first PCB 331 may be disposed at an area in the electronic device 100. According to an embodiment, the second PCB 332 may be spaced apart from the first PCB 331 and positioned in −Z direction with reference to the first PCB 331. For example, the second PCB 332 may be disposed to face a surface facing −z direction of the first PCB 331. According to an embodiment, the first PCB 331 and/or the second PCB 332 may be a printed circuit board (PCB) including a material having an unbendable attribute (e.g.: FR4). According to another embodiment, the first PCB 331 and/or the second PCB 332 may be a flexible printed circuit board (FPCB) including a material having a bendable attribute (or "flexible attribute").

According to an embodiment, the interposer 340 may be interposed between the first PCB 331 and the second PCB 332 and coupled to the first PCB 331 and the second PCB 332. For example, the interposer 340 may be disposed to surround a space between the first PCB 331 and the second PCB 332. In an embodiment, the interposer 340 may include a PCB including at least one side wall and/or a conductive via passing through at least one area of a PCB. According to an embodiment, the first PCB 331 and the second PCB 332 may be electrically connected to each other through the at least one conductive via of the interposer 340.

According to an embodiment, multiple electronic components may be disposed on the first PCB 331 and/or the second PCB 332 constituting the printed circuit board structure 330. For example, a processor (or control circuit) (e.g.: processor 1120 of FIG. 11), a memory (e.g.: memory 1130 of FIG. 11), and/or an interface (interface 1177 of FIG. 11) may be disposed on the first PCB 331 and/or the second PCB 332. According to an embodiment, multiple electronic components disposed on the first PCB 331 and multiple electronic components disposed on the second PCB 332 may be electrically and/or operatively connected to each other through the interposer 340.

According to an embodiment, the interposer 340 may include a power source interface, a USB interface, an MIPI interface, a radio frequency (RF) interface, through-silicon vias, wires, and a ground (GND) terminal. For example, the first PCB 331 may transfer a digital signal associated with an RF band to the second PCB 332 through the interposer 340.

According to an embodiment, a control circuit (not shown) may heat at least a portion of the interposer 340. According to an embodiment, as the control circuit heats at least a portion of the interposer 340, the connection between the interposer 340 and the first PCB 331 and/or the second PCB 332 may be released. The detailed description thereof will be given below.

According to an embodiment, the first PCB 331 and/or the second PCB 332 of the printed circuit board structure 330 may be electrically connected to a third PCB 333 disposed to be spaced apart from the printed circuit board structure 330. According to an embodiment, the first PCB 331 and/or the second PCB 332 may be electrically connected to the third PCB 333 through a connection member 334. For example, the connection member 334 may pass through a disposed battery 370 and electrically connect the first PCB 331 and/or the second PCB 332 to the third PCB 333. For example, the connection member 334 may include at least one of a flexible printed circuit board (FPCB), a coaxial cable, and a board to board (B to B) connector, but is not limited thereto.

According to an embodiment, the printed circuit board structure 330 may include an area (hereinafter, referred to "flexible area") having a bendable or flexible attribute. In an embodiment, the flexible area may include a base film (or substrate) or a copper clad layer. For example, the flexible area may be a flexible copper clad laminate (FCCL) in which at least one copper clad is laminated on at least a portion of at least one area of the upper or lower ends of a polyimide film.

According to an embodiment, the first PCB 331 and/or the second PCB 332 of the printed circuit board structure 330 may be electrically connected to a fourth PCB (not shown) disposed to be spaced apart from the printed circuit board structure 330. For example, the fourth PCB may be a flexible printed circuit board type radio frequency cable (FRC). In an embodiment, the fourth PCB may be disposed in an internal space of the electronic device 100, adjacent to the metal frame 118. For example, the fourth PCB may be disposed in an area (e.g.: area in +x direction of FIG. 3) and/or another area (e.g.: area in −x direction of FIG. 3) of the electronic device 100.

According to an embodiment, the shield structure 350 (or "shield can") may be formed of a conductive material (e.g.: metal), and disposed on at least one area of the printed circuit board structure 330 to electromagnetically shield multiple electronic components arranged on the printed circuit board structure 330. In an embodiment, the shield structure 350 may be partially disposed on the second PCB 332 of the printed circuit board structure 330 and electromagnetically shield multiple electronic components arranged on the second PCB 332.

According to an embodiment, the rear case 360 may be disposed in −z direction of the printed circuit board structure 330 and protect the printed circuit board structure 330 and multiple electronic components arranged on the printed circuit board structure 330 from an external force applied to the electronic device 100. For example, the rear case 360 may be formed of a nonconductive material (e.g.: plastic), but is not limited thereto. The rear case 360 may be omitted from the electronic device 100 according to another embodiment.

According to an embodiment, the battery 370 may be disposed in the electronic device 100 and supply power to at least one component of the electronic device 100. For example, the battery 370 may include a non-rechargeable primary battery, or a rechargeable secondary battery, or a fuel cell. According to an embodiment, the battery 370 may be disposed in the electronic device 100 in an integrated form, but is not limited thereto, and the battery 370 according to another embodiment may be disposed to be detachable or attachable to the electronic device 100.

According to an embodiment, the rear plate 111 may form a rear surface (e.g.: second surface 110B of FIG. 2) of the electronic device 100. The rear plate 111 may protect internal components of the electronic device 100 from an external impact or foreign substance introduction.

Figure 4:
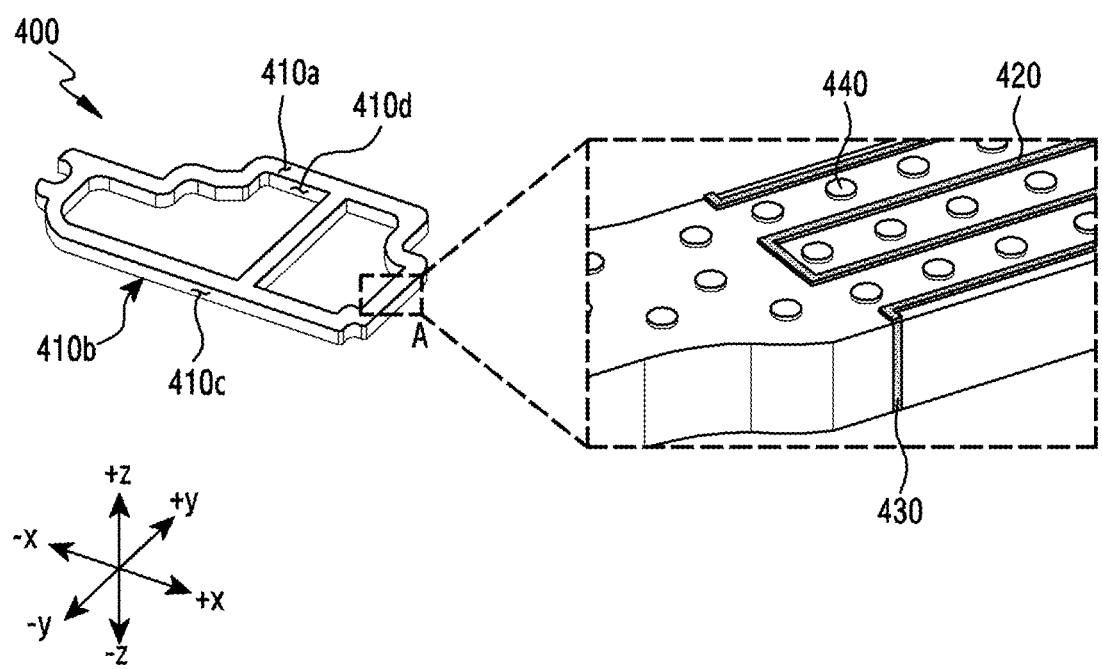
FIG. 4 is a view illustrating an interposer and an enlarged view of region A of the interposer according to an embodiment.

FIG. 4 is a view illustrating an interposer and an enlarged view of region A of the interposer according to an embodiment. The interposer 400 illustrated in FIG. 4 may be a structure of the interposer 340 interposed between the first PCB 331 and the second PCB 332 of FIG. 3. For example, the interposer 400 may be disposed in an electronic device (e.g.: electronic device 100 of FIG. 1 to FIG. 3) and may be disposed to electrically connect the first PCB 331 and the second PCB 332.

According to an embodiment, the interposer 400 may have a copper clad laminate structure having multiple pre-impregnated material (PPG, PREPREG) layers (e.g.: insulative resin layer) and a copper clad interposed between PPG layers. According to an embodiment, the interposer 400 may be formed in a loop shape with an opening or in a closed loop shape.

Referring to FIG. 4, the interposer 400 (e.g.: interposer 340 of FIG. 3) according to an embodiment may include multiple pads 440, a heat conduction pattern 420, and a lateral conductive part 430 connected to the heat conduction pattern 420. According to another embodiment, the interposer 400 may include a conductive via (not shown) passing through the inside of the interposer 400 and connected to the multiple pads 440.

According to an embodiment, the interposer 400 may include multiple pads 440 arranged on one surface of the interposer 400. According to an embodiment, the multiple pads 440 may include a conductive material (e.g.: copper (Cu)). For example, the multiple pads 440 may have a circular shape and may be arranged on a first surface 410a of the interposer 400. According to an embodiment, the multiple pads 440 may be arranged to be spaced apart from each other on one surface of the interposer 400. For example, the multiple pads 440 may be arranged to be spaced apart from each other by a specified distance on a first surface 410a of the interposer 400. According to an embodiment, the conductive material (or conductive ingredient) composing at least a portion of the multiple pads 440 may be variously formed. For example, the conductive material may include at least one of silver paste, aluminum, silver-aluminum, carbon paste, or carbon nanotube paste (CNT), but is not limited thereto.

According to an embodiment, the interposer 400 may include a heat conduction pattern 420 disposed on one surface of the interposer 400. For example, the heat conduction pattern 420 may be disposed on the first surface 410a. According to another embodiment (not shown), the multiple pads 440 and the heat conduction pattern 420 may be arranged on a second surface 410b. According to an embodiment, the heat conduction pattern 420 may be disposed on an area between the multiple pads 440. The detailed description thereof will be given below.

According to an embodiment, the heat conduction pattern 420 may have one end connected to the lateral conductive part 430. According to an embodiment, the lateral conductive part 430 may be disposed on a first lateral surface 410c and/or a second lateral surface 410d of the interposer 400. For example, the lateral conductive part 430 may extend from the heat conduction pattern 420 on a boundary between the first surface 410a and the first lateral surface 410c to be disposed on the first lateral surface 410c. According to an embodiment, the lateral conductive part 430 may include a conductive material (e.g.: copper (Cu)) substantially identical to the material of the heat conduction pattern 420, but is not limited thereto.

According to an embodiment, a solder (not shown) may be disposed on one surface of the multiple pads 440. For example, the solder may be disposed in +z direction on the multiple pads 440. For example, the solder may include a conductive material (e.g.: lead (Pb)). According to an embodiment, in order to stably fix the multiple PCBs (e.g.: first PCB 331 and second PCB 332 of FIG. 3), the multiple pads 440 (e.g.: land) are formed on the upper and/or lower end of at least one via passing through the interposer 400 and then the multiple PCBs are fixed (or "soldered") to the interposer 440 by using a pre-solder to which the multiple pads 440 are seated. According to an embodiment, the pre-soldering may be performed through a reflow process when the first PCB (e.g.: first PCB 331 of FIG. 3) and the second PCB (e.g.: second PCB 332 of FIG. 3) are coupled to the interposer 400. For example, the reflow process may be performed by supplying a solder to the multiple pads 440 in advance, followed by melting for connection by using an external heat source, and may include a soldering process for soldering to a printed circuit board. In an embodiment, the soldering process is not limited to the reflow soldering, and may use various soldering methods such as flow soldering.

Figure 5A:
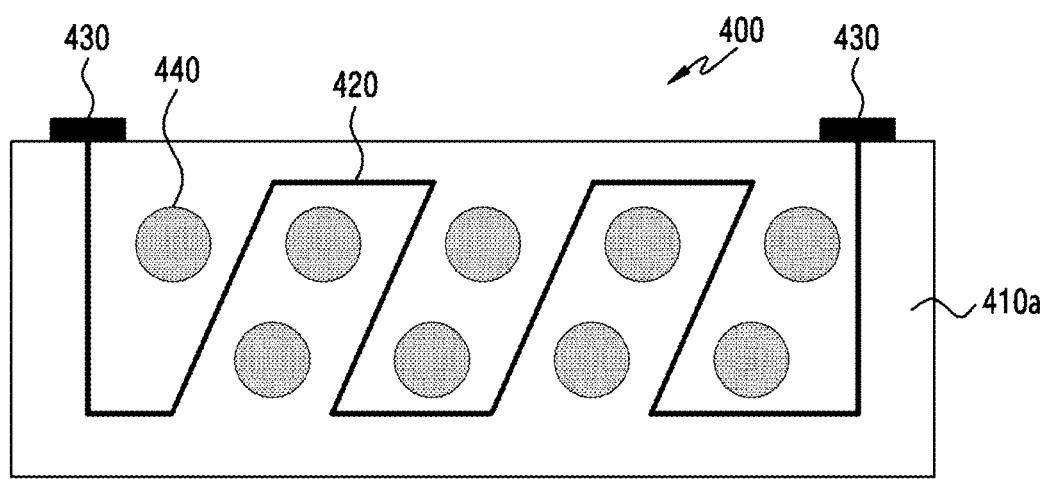
FIG. 5A is a plan view of an interposer including a heat conduction pattern connected to a lateral conductive part according to an embodiment.
Figure 5B:
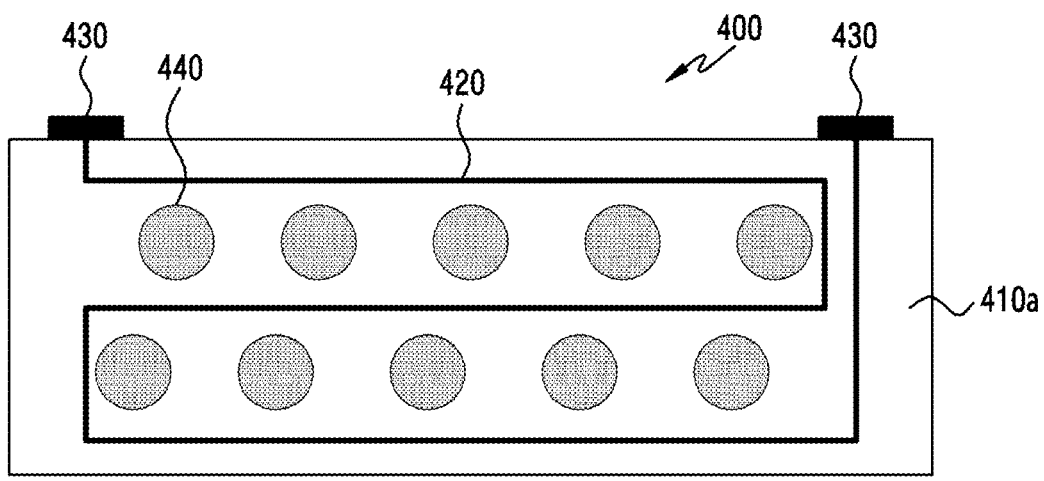
FIG. 5B is a plan view of an interposer including a heat conduction pattern connected to a lateral conductive part according to another embodiment.

FIG. 5A is a plan view of an interposer including a heat conduction pattern connected to a lateral conductive part according to an embodiment. FIG. 5B is a plan view of an interposer including a heat conduction pattern connected to a lateral conductive part according to another embodiment.

Referring to FIG. 5A and FIG. 5B together, the interposer 400 may include multiple pads 440 on a first surface 410a of the interposer 400, a heat conduction pattern 420, and a lateral conductive part 430 connected to the heat conduction pattern 420. In connection with the aforementioned description, like or similar reference numerals may be used for like or similar elements and overlapping description thereof will be omitted.

According to an embodiment, the heat conduction pattern 420 may be disposed on an area between the multiple pads 440. According to an embodiment, the heat conduction pattern 420 may be disposed to pass through an area between the multiple pads 440 on the first surface 410a. According to another embodiment (not shown), the multiple pads 440 and the heat conduction pattern 420 may be arranged on a second surface 410c.

Referring to FIG. 5A, for example, the multiple pads 440 may be arranged in n columns on the first surface 410a and the heat conduction pattern 420 may be disposed to pass through an area between a n−1th column and a nth column. Referring to FIG. 5B, for another example, the multiple pads 440 may be arranged in n rows and the heat conduction pattern 420 may be disposed to pass through an area between a n−1th row and a nth row, but the arrangement of the heat conduction pattern 420 is not limited thereto.

According to an embodiment, one end and the other end of the heat conduction pattern 420 may be connected to the lateral conductive part 430. According to an embodiment, the lateral conductive part 430 may extend from the one end and the other end of the heat conduction pattern 420 to be disposed on a first lateral surface 410b and/or a second lateral surface 410d. According to an embodiment, the lateral conductive part 430 and the heat conduction pattern 420 may be integrally formed and may be disposed on the first surface 410a and the first lateral surface 410b, or the second lateral surface 410d. According to an embodiment, at least a portion of the lateral conductive part 430 may be electrically connected to a ground of a PCB (e.g.: first PCB 331 and/or second PCB 332 of FIG. 3). For example, the heat conduction pattern 420 may be electrically connected to a ground of a PCB through the lateral conductive part 430.

According to an embodiment, a control circuit (not shown) may heat the heat conduction pattern 420 by applying a voltage to the heat conduction pattern 420 through the lateral conductive part 430. According to an embodiment, the control circuit may heat a solder and the multiple pads 440 adjacent to the heat conduction pattern 420 by heating the heat conduction pattern 420. The detailed description thereof will be given below.

Figure 6A:
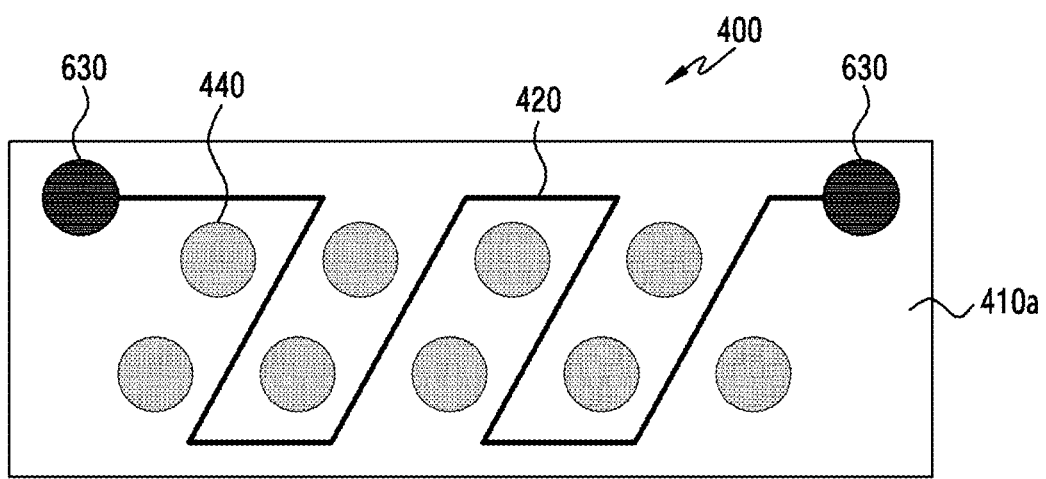
FIG. 6A is a plan view of an interposer including a heat conduction pattern connected to an internal pad according to an embodiment.
Figure 6B:
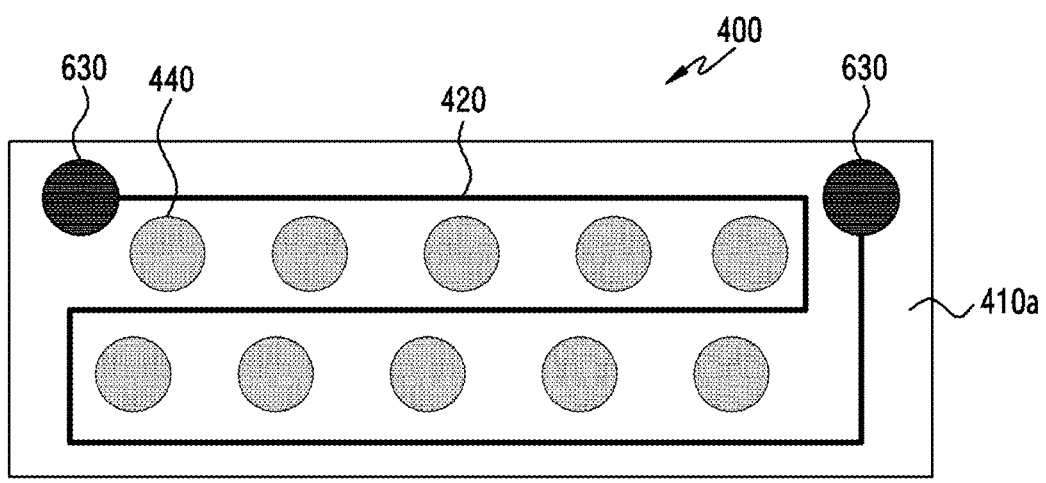
FIG. 6B is a plan view of an interposer including a heat conduction pattern connected to an internal pad according to another embodiment.

FIG. 6A is a plan view of an interposer including a heat conduction pattern connected to an internal pad according to an embodiment. FIG. 6B is a plan view of an interposer including a heat conduction pattern connected to an internal pad according to another embodiment.

Referring to FIG. 6A and FIG. 6B together, the interposer 400 may include multiple pads 440 on a first surface 410a of the interposer 400, a heat conduction pattern 420, and at least one internal pad 630 connected to the heat conduction pattern 420. In connection with the aforementioned description, like or similar reference numerals may be used for like or similar elements and overlapping description thereof will be omitted.

According to an embodiment, the heat conduction pattern 420 may be disposed on an area between the multiple pads 440. According to an embodiment, the heat conduction pattern 420 may be disposed to pass through an area between the multiple pads 440 on the first surface 410a. According to another embodiment (not shown), the multiple pads 440 and the heat conduction pattern 420 may be arranged on a second surface 410c.

Referring to FIG. 6A, for example, the multiple pads 440 may be arranged in n columns and the heat conduction pattern 420 may be disposed to pass through an area between a n−1th column and a nth column. Referring to FIG. 6B, for another example, the multiple pads 440 may be arranged in n rows and the heat conduction pattern 420 may be disposed to pass through an area between a n−1th row and a nth row, but the arrangement of the heat conduction pattern 420 is not limited thereto.

According to an embodiment, one end and the other end of the heat conduction pattern 420 may be connected to the at least one internal pad 630. According to an embodiment, the at least one internal pad 630 may extend from the one end and the other end of the heat conduction pattern 420 to be disposed on the same plan as the heat conduction pattern 420. For example, the heat conduction pattern 420 and the at least one internal pad 630 may be arranged on a first surface 410a of the interposer 400. According to an embodiment, the internal pad 630 and the heat conduction pattern 420 may be integrally formed and disposed on the first surface 410a. According to an embodiment, at least a portion of the internal pad 630 may be electrically connected to a ground of a PCB (e.g.: first PCB 331 and/or second PCB 332 of FIG. 3). For example, the heat conduction pattern 420 may be electrically connected to a ground of a PCB through the internal pad 630. According to another embodiment, at least one of different lateral surfaces (e.g.: first lateral surface 410c or second lateral surface 410d of FIG. 4) may include the lateral conductive part (e.g.: lateral surface 430 of FIG. 4) on a first area and may include the internal pad 630 on a second area differentiated from the first area. For example, the first lateral surface (e.g.: first lateral surface 410c of FIG. 4) may include the lateral conductive part (e.g.: lateral conductive part 430 of FIG. 4) and the internal pad 630.

According to an embodiment (not shown), one end and the other end of the heat conduction pattern 420 may be connected to the different lateral surfaces (e.g.: first lateral surface 410c or second lateral surface 410d of FIG. 4), respectively. For example, one end of the heat conduction pattern 420 may be connected to the first lateral surface 410c of the interposer 400 and the other end thereof may be connected to the second lateral surface 410d of the interposer 400. In addition, according to an embodiment, one end and/or the other end of the heat conduction pattern 420 may be connected to the lateral conductive part 430 and/or the internal pad 630.

According to an embodiment (not shown), the heat conduction pattern 420 is illustrated as being disposed to pass through an area between the multiple pads 440, but is not limited thereto. For example, a space for stably seating a pre-solder through at least one conductive via included in the interposer 400 without forming the multiple pads 440 (e.g.: land). For example, the interposer 400 may be formed to be a landless structure having no pads (e.g.: land) and the heat conductive pattern 420 may be disposed to pass through an area between the conductive vias of the interposer 400.

Figure 7:
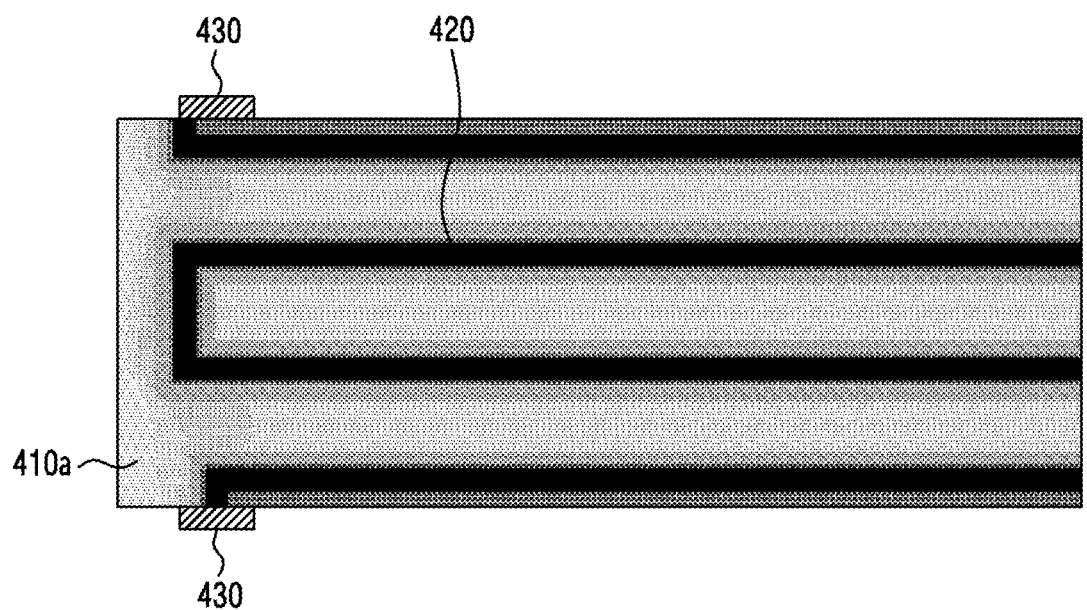
FIG. 7 is a view illustrating a heat conduction state according to heating a heat conduction pattern according to an embodiment.

FIG. 7 is a view illustrating a heat conduction state according to heating a heat conduction pattern according to an embodiment.

Referring to FIG. 7, an electronic device (e.g.: electronic device 1101 of FIG. 11) may include a control circuit (not shown) disposed in an internal space of the electronic device. In connection with the aforementioned description, like or similar reference numerals may be used for like or similar elements and overlapping description thereof will be omitted.

According to an embodiment, a control circuit may apply a voltage or current to the heat conduction pattern 420 through the lateral conductive part 430. Referring to FIG. 6A and FIG. 6B together, a control circuit according to another embodiment may apply a voltage or current to the heat conduction pattern 420 through the internal pad 630. Hereinafter, it is assumed that the control circuit applies a voltage or current to the heat conduction pattern 420 through the lateral conductive part 430.

According to an embodiment, the control circuit may heat the heat conduction pattern 420 by applying a voltage to the heat conduction pattern 420 through the lateral conductive part 430. According to an embodiment, the control circuit heats the heat conduction pattern 420, which may heat an area adjacent to the heat conduction pattern 420 in one surface (e.g.: first surface 410*a*) of the interposer 400. For example, a first area adjacent to the heat conduction pattern 420 in the first surface 410*a* of the interposer 400 may have a first temperature and a second area relatively not adjacent to the heat conduction pattern 420 in the first surface 410*a* of the interposer 400 may have a second temperature lower than the first temperature. According to an embodiment, a temperature of the first surface 410*a* of the interposer 400 may gradually change according to a proximity to the heat conduction pattern 420. For example, a temperature distribution of the first surface 410*a* may gradually decrease from the first temperature to the second temperature as the distance from the heat conduction pattern 420 increase.

Referring to FIG. 4 and FIG. 7 together, as the control circuit heats the heat conduction pattern 420 by applying a voltage thereto, a temperature of the multiple pads 440 adjacent to the heat conduction pattern 420 may increase. According to an embodiment, as the temperature of the multiple pad 440 increases, a temperature of a solder disposed on the multiple pads 440 may increase. For example, as the control circuit heats the heat conduction pattern 420, the temperature of the solder and the multiple pads 440 adjacent to the heat conduction pattern 420 increases, and the solder may be converted into a state to be easily separated (e.g.: liquid state or high viscosity state). According to another embodiment, as the temperature of the solder increases by being heated by a user, the solder may be converted into a liquid state.

Figure 8:
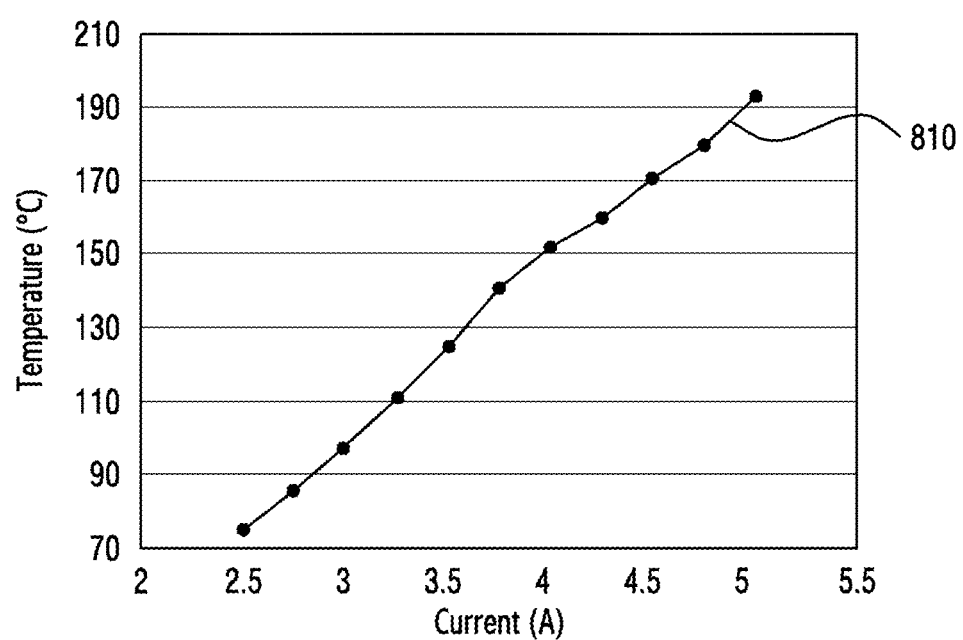
FIG. 8 is a view illustrating a temperature transmitted to a pad according to a level of a current applied to a heat conduction pattern.

FIG. 8 is a view illustrating a temperature transmitted to a pad according to a level of a current applied to a heat conduction pattern. In a graph shown in FIG. 8, the horizontal axis shows the applied current and the vertical axis shows the temperature.

Referring to FIG. 4, FIG. 7, and FIG. 8 together, a temperature (e.g.: maximum temperature) 810 of the multiple pads 440 may change according to a current A applied to the heat conduction pattern 420 according to an embodiment. As the heat conduction pattern 420 according to an embodiment is heated, a temperature of the multiple pads 440 adjacent to the heat conduction pattern 420 may increase. For example, the multiple pads 440 adjacent to the heat conduction pattern 420 and the solder disposed on the multiple pads 440 may be increased in temperature due to indirectly heating by the heat conduction pattern 420.

According to an embodiment, as an amount of a current applied to the heat conduction pattern 420 increases, the temperature 810 of the multiple pads 440 adjacent to the heat conduction pattern 420 may increase. For example, when the amount of the current applied to the heat conduction pattern 420 increases from 3A to 4A, the temperature 810 of the multiple pads 440 adjacent to the heat conduction pattern 420 may increase from about 100 degrees to about 150 degrees.

Figure 9:
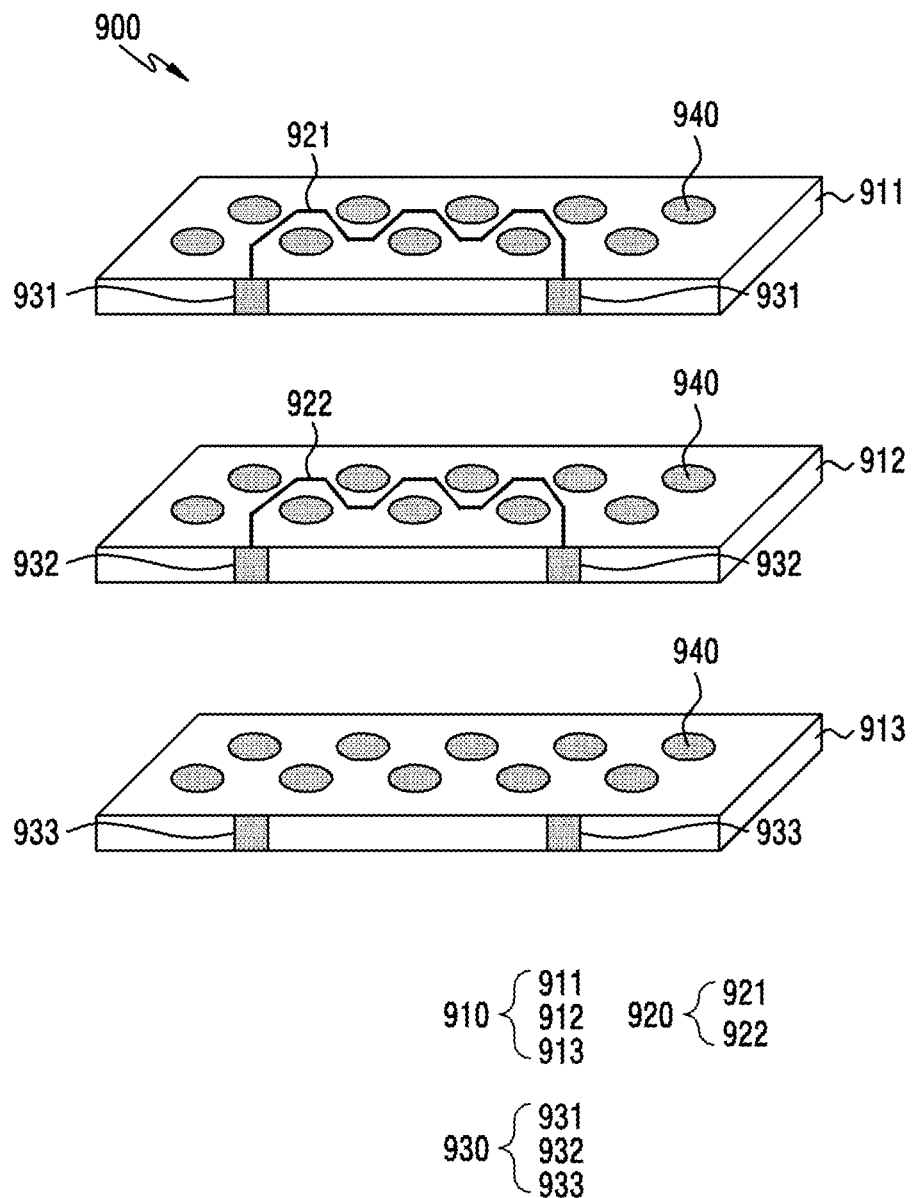
FIG. 9 is a view illustrating a structure including multiple interposers according to an embodiment.

FIG. 9 is a view illustrating a structure including multiple interposers according to an embodiment.

Referring to FIG. 9, the interposer structure 900 may include multiple interposers 910 (e.g.: interposer 340 of FIG. 3 or interposer 400 of FIG. 4). According to an embodiment, the interposer structure 900 may be formed by stacking multiple interposers 910.

According to an embodiment, each of multiple interposers may include multiple pads 940 (e.g.: multiple pads 440 of FIG. 4), a heat conduction pattern 920 (e.g.: heat conduction pattern 420 of FIG. 4), and a lateral conductive part 930 (e.g.: lateral conductive part 430 of FIG. 3) on one surface thereof. According to another embodiment, a portion of the multiple interposers 910 may omit some (e.g.: heat conduction pattern 920) of the components described above.

According to an embodiment, a portion of the multiple interposers 910 may include a heat conduction pattern (e.g.: first heat conduction pattern 921 or second heat conduction pattern 922) and/or multiple pads 940. For example, a first interposer 911 may include multiple pads 940 and a first heat conduction pattern 921 disposed to pass through an area between the multiple pads 940. For example, a second interposer 912 may include multiple pads 940 and a second heat conduction pattern 922 disposed to pass through an area between the multiple pads 940. For example, a third interposer 913 may include multiple pads 940.

According to an embodiment, each of the multiple interposers 910 may include a lateral conductive part 930. For example, the first interposer 911 may include a first lateral conductive part 931. For example, the second interposer 912 may include a second lateral conductive part 932, and the third interposer 913 may include a third lateral conductive part 933. According to an embodiment, the multiple interposers 910 may integrally formed to form a lateral conductive part 930 in which multiple lateral conductive parts (e.g.: first lateral conductive part 931, second lateral conductive part 932, and third lateral conductive part 933) are combined. For example, the first lateral conductive part 931, the second lateral conductive part 932, and the third lateral conductive part 933 may be electrically connected to each other, based on the combination of the multiple interposers 910, and at least a portion of each lateral conductive part 931, 932, and 933 may be formed to be in contact with each other. According to another embodiment (not shown), at least a portion of the multiple interposers 910 may include a conductive via electrically connected to the lateral conductive part 930. For example, the third interposer 913 may include a conductive via therein, and the conductive via may be electrically connected to the third lateral conductive part 933. For example, the second interposer 912 may include a conductive via therein and may be coupled to the first interposer 911, and thus the conductive via may be electrically connected to the first lateral conductive part 931.

Figure 10:
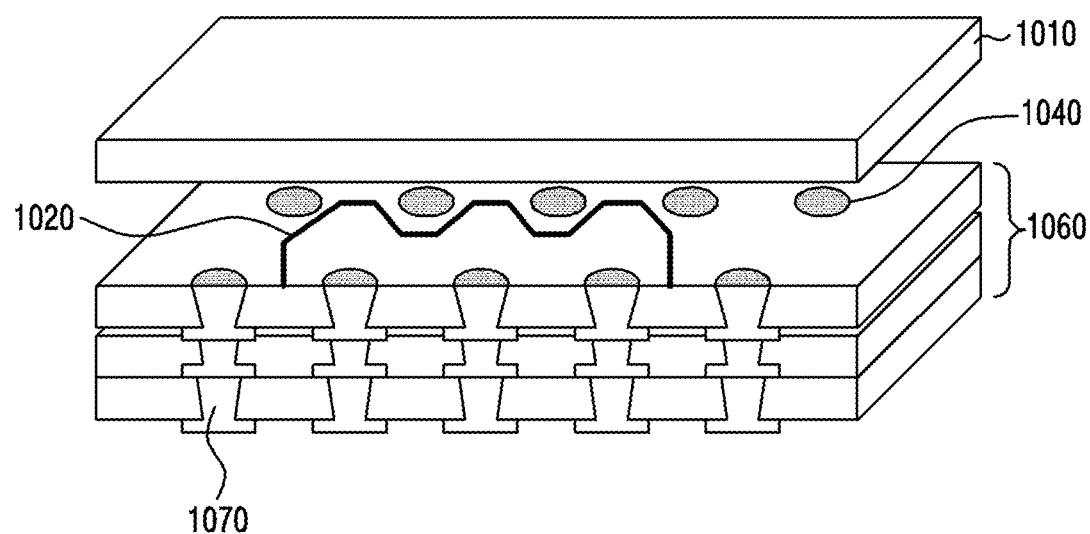
FIG. 10 is a view illustrating a printed circuit board including a heat conduction pattern and a pad and coupled to an interposer according to an embodiment.

FIG. 10 is a view illustrating a printed circuit board including a heat conduction pattern and a pad, and coupled to an interposer according to an embodiment.

Referring to FIG. 10, a PCB 1060 (e.g.: first PCB 331 of FIG. 3) coupled to an interposer 1010 (e.g.: interposer 340 of FIG. 3 or interposer 400 of FIG. 4) may include multiple pads 1040 (e.g.: multiple pads 440 of FIG. 4), at least one conductive via 1070 passing through the inside of the PCB 1060, and a heat conduction pattern 1020 (e.g.: heat conduction pattern 420 of FIG. 4).

According to an embodiment, the multiple pads 1040 may be arranged on one surface adjacent to the interposer 1010 in the PCB 1060. According to an embodiment, the heat conduction pattern 1020 may be disposed on a surface substantially identical to a surface on which the multiple pads 1040 are arranged in the PCB 1060. According to an embodiment, the heat conduction pattern 1020 may be disposed to pass through an area between the multiple pads 1040. For example, the heat conduction pattern 1020 may be disposed to surround a portion of the multiple pads 1040, but is not limited thereto.

According to an embodiment, the heat conduction pattern 1020 may be electrically connected to the at least one conductive via 1070. According to another embodiment (not shown), the heat conduction pattern 1020 may be electrically connected to a lateral conductive part.

According to an embodiment, the PCB 1060 may be electrically connected to a control circuit (not shown). According to an embodiment, the control circuit may apply a voltage or current to the heat conduction pattern 1020 through the at least one conductive via 1070. According to an embodiment, the control circuit may control the temperature of the heat conduction pattern 1020 by applying a voltage to the at least one conductive via 1070 electrically connected to the heat conduction pattern 1020. For example, the control circuit may heat the heat conduction pattern 1020 by applying a voltage to the at least one conductive via 1070 electrically connected to the heat conduction pattern 1020. According to another embodiment, the control circuit may control the temperature of the heat conduction pattern 1020 by applying a voltage or current to an internal pad (not shown) and a lateral conductive part (not shown) electrically connected to the heat conduction pattern 1020. For example, the control circuit may heat the heat conduction pattern 1020 by applying a voltage to a lateral conductive part. According to an embodiment, as the control circuit heats the heat conduction pattern 1020, the coupling between the interposer 1010 and the PCB 1060 may be formed or released. For example, as the control circuit heats the heat conduction pattern 1020, a portion of the multiple pad 1040 adjacent to the heat conduction pattern 1020 and a solder disposed on the multiple pads 1040 are heated, and thereby the coupling between the interposer 1010 and the PCB 1060 may be released.

FIG. 11 is a block diagram illustrating an electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In some embodiments, at least one of the components (e.g., the connecting terminal 1178) may be omitted from the electronic device 1101, or one or more other components may be added in the electronic device 1101. In some embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thererto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In another embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked.

The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, an electronic device may include a first printed circuit board (PCB), a second PCB having a shape corresponding to the first PCB, and an interposer surrounding a space between the first PCB and the second PCB and including multiple pads, wherein the interposer may include a first surface in contact with the first PCB, a second surface in contact with the second PCB, a first lateral surface facing the space, a second lateral surface facing the first lateral surface, a first point exposed through the second lateral surface, a second point exposed through one of the first lateral surface or the second lateral surface, and a heat conduction pattern disposed on the first surface in an area between the multiple pads to connect the first point and the second point.

According to an embodiment, the heat conduction pattern and the multiple pads may include copper (Cu).

According to an embodiment, the heat conduction pattern may be electrically connected to a ground of the first PCB through the second point of the interposer.

According to an embodiment, the multiple pads may be arranged on the first surface and the second surface of the interposer.

According to an embodiment, the electronic device may include a solder disposed on the multiple pads.

According to an embodiment, the first PCB and the second PCB may be fixed to the interposer through the solder.

According to an embodiment, the multiple pads may be arranged on the first surface and/or the second surface of the interposer.

According to an embodiment, the electronic device may include a control circuit, and the control circuit may apply a voltage to the first point of the first lateral surface.

According to an embodiment, the second PCB may include a conductive via configured to connect the interposer to the first point, and the control circuit may apply a voltage to the first point through the conductive via.

According to an embodiment, the heat conduction pattern may be adjacent to the multiple pads and spaced apart from the multiple pads to avoid a direct contact with the multiple pads.

An interposer according to an embodiment may include a first surface, a second surface parallel to the first surface, a first lateral surface perpendicular to the first surface and the second surface, and a second lateral surface parallel to the first lateral surface. According to an embodiment, the interposer may include multiple pads arranged on the first surface of the interposer to allow one ends thereof to be exposed, a first point exposed through the second lateral surface, a second point exposed through one of the first lateral surface or the second lateral surface, and a heat conduction pattern disposed on the first surface in an area between the multiple pads to connect the first point and the second point.

The heat conduction pattern according to an embodiment may include copper (Cu).

According to an embodiment, the multiple pads may be arranged on the first surface and the second surface of the interposer.

An interposer according to an embodiment may include a solder disposed on the multiple pads.

According to an embodiment, the the multiple pads may include copper (Cu).

According to an embodiment, an electronic device may include a first printed circuit board (PCB), a second PCB having a shape corresponding to the first PCB, and an interposer forming a closed space by coupling to the first PCB and the second PCB and including multiple pads, the interposer may include a heat conduction pattern disposed on a surface of the interposer, and the heat conduction pattern may connect a first point on the surface of the interposer to a second point different from the first point and may be disposed on an area between the multiple pads.

According to an embodiment, the first point or the second point may be disposed on a surface in which the interposer is coupled to the first PCB.

According to an embodiment, the heat conduction pattern may be electrically connected to a ground of the first PCB through the second point.

The electronic device according to an embodiment may include a control circuit, and the control circuit may apply a voltage to the first point.

According to an embodiment, the heat conduction pattern may include copper (Cu).

Although the present disclosure has been described with various embodiments, various changes and modifications may be suggested to one skilled in the art. It is intended that the present disclosure encompass such changes and modifications as fall within the scope of the appended claims.

What is claimed:

1. An electronic device comprising:
a first printed circuit board (PCB);
a second PCB having a shape corresponding to the first PCB; and
an interposer surrounding a space between the first PCB and the second PCB and comprising multiple pads,
wherein the interposer comprises:
a first surface in contact with the first PCB,
a second surface in contact with the second PCB,
a first lateral surface facing the space,
a second lateral surface opposite to the first lateral surface,
a heat conduction pattern disposed on the first surface in an area between the multiple pads to connect a first point and a second point, wherein a first end portion of the heat conduction pattern is connected to the first point on a first edge portion between the first surface and the second lateral surface, and wherein a second end portion of the heat conduction pattern is connected to the second point on a second edge portion between the first surface and the first lateral surface;
a first lateral conductive part disposed on the second lateral surface and extended from the first end portion of the heat conduction pattern; and
a second lateral conductive part disposed on the first lateral surface and extended from the second end portion of the heat conduction pattern.

2. The electronic device of claim 1, wherein the heat conduction pattern and the multiple pads comprise copper (Cu).

3. The electronic device of claim 1, wherein the heat conduction pattern is electrically connected to a ground of the first PCB through the second point of the interposer.

4. The electronic device of claim 1, wherein the multiple pads are arranged on the first surface and the second surface of the interposer.

5. The electronic device of claim 1, comprising a solder disposed on the multiple pads.

6. The electronic device of claim 5, wherein the first PCB and the second PCB are fixed to the interposer through the solder.

7. The electronic device of claim 1, wherein the multiple pads are arranged on the first surface or the second surface of the interposer.

8. The electronic device of claim 1, further comprising a control circuit,
wherein the control circuit is configured to apply a voltage to the first point of the first lateral surface.

9. The electronic device of claim 8, wherein:
the second PCB comprises a conductive via configured to connect the interposer to the first point, and
the control circuit is configured to apply the voltage to the first point through the conductive via.

10. The electronic device of claim 1, wherein the heat conduction pattern is adjacent to the multiple pads and spaced apart from the multiple pads to avoid a direct contact with the multiple pads.

11. An interposer comprising:
a first surface;
a second surface parallel to the first surface;
a first lateral surface perpendicular to the first surface and the second surface;
a second lateral surface parallel to the first lateral surface;
multiple pads arranged on the first surface of the interposer to allow an end of each pad to be exposed;
a heat conduction pattern disposed on the first surface in an area between the multiple pads to connect a first point and a second point, wherein a first end portion of the heat conduction pattern is connected to the first point on a first edge portion between the first surface and the second lateral surface, and wherein a second end portion of the heat conduction pattern is connected to the second point on a second edge portion between the first surface and the first lateral surface;
a first lateral conductive part disposed on the second lateral surface and extended from the first end portion of the heat conduction pattern; and
a second lateral conductive part disposed on the first lateral surface and extended from the second end portion of the heat conduction pattern.

12. The interposer of claim 11, wherein the heat conduction pattern comprises copper (Cu).

13. The interposer of claim 11, wherein the multiple pads are arranged on the first surface and the second surface of the interposer.

14. The interposer of claim 11, comprising a solder disposed on the multiple pads.

15. The interposer of claim 11, wherein the multiple pads comprise copper (Cu).

16. An electronic device comprising:
a first printed circuit board (PCB);
a second PCB having a shape corresponding to the first PCB; and
an interposer forming a closed space by coupling to the first PCB and the second PCB and comprising multiple pads,
wherein the interposer comprises;
a heat conduction pattern disposed on a surface of the interposer and on an area between the multiple pads, wherein the heat conduction pattern connects a first point and a second point of the surface of the interposer, wherein a first end portion of the heat conduction pattern is connected to the first point on a first edge portion between the surface and a first lateral surface of the interposer, and wherein a second end portion of the heat conduction pattern is connected to the second point on a second edge portion between the surface and a second lateral surface of the interposer;
a first lateral conductive part disposed on the first lateral surface and extended from the first end portion of the heat conduction pattern; and
a second lateral conductive part disposed on the second lateral surface and extended from the second end portion of the heat conduction pattern.

17. The electronic device of claim 16, wherein the first point or the second point is disposed on a surface of the interposer coupled to the first PCB.

18. The electronic device of claim 17, wherein the heat conduction pattern is electrically connected to a ground of the first PCB through the second point.

19. The electronic device of claim 17, further comprising a control circuit,
wherein the control circuit applies a voltage to the first point.

20. The electronic device of claim 16, wherein the heat conduction pattern comprises copper (Cu).

* * * * *